(12) United States Patent
Sundaram et al.

(10) Patent No.: US 6,359,814 B1
(45) Date of Patent: Mar. 19, 2002

(54) NEGATIVE OUTPUT VOLTAGE CHARGE PUMP AND METHOD THEREFOR

(75) Inventors: Rajesh Sundaram, Fair Oaks; Kerry D. Tedrow, Folsom, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/753,351

(22) Filed: Dec. 29, 2000

(51) Int. Cl.$^7$ .............................. G11C 7/00; G05F 1/10
(52) U.S. Cl. .............................. 365/189.09; 365/189.11; 327/535; 331/17
(58) Field of Search ..................... 365/189.09, 189.11; 327/535, 536; 331/17; 363/59, 60

(56) References Cited

U.S. PATENT DOCUMENTS

| | | | | | |
|---|---|---|---|---|---|
| 5,694,072 A | * | 12/1997 | Hsiao et al. | ................ | 327/537 |
| 5,920,226 A | * | 7/1999 | Mimura | ................... | 327/537 |
| 6,016,073 A | * | 1/2000 | Ghilardelli et al. | .......... | 327/536 |
| 6,018,264 A | * | 1/2000 | Jin | ............................. | 327/536 |
| 6,107,862 A | * | 8/2000 | Mukainakano et al. | ..... | 327/536 |
| 6,160,723 A | * | 12/2000 | Liu | ............................. | 363/60 |

* cited by examiner

Primary Examiner—Son T. Dinh
(74) Attorney, Agent, or Firm—Blakely, Sokoloff, Taylor & Zafman LLP

(57) ABSTRACT

A negative voltage charge pump including a regulation circuit. The regulation circuit has a level shift ladder including a plurality of level shifters connected in series. One end of the level shift ladder receives a power supply voltage and the other end receives the negative output of the charge pump. A feedback voltage is generated from one of the intermediate nodes of the level shift ladder. A differential amplifier generates a regulation voltage which varies as a function of the feedback voltage and a reference voltage. The regulation voltage is applied to a frequency control input of a voltage-controlled oscillator for generating a signal that drives the charge pump. Each of the level shifters of the level shift ladder can be a triple well device that can be configured to handle negative voltages without forward biasing an internal p-n junction.

26 Claims, 3 Drawing Sheets

NEGATIVE OUTPUT VOLTAGE CHARGE PUMP AND METHOD THEREFOR

FIELD OF THE INVENTION

This invention relates generally to charge pumps, and in particular, to a method and apparatus for regulation of a negative output voltage charge pump.

BACKGROUND OF THE INVENTION

Many applications require circuits that can boost up an input power supply DC voltage to a higher DC voltage used for specialized operations. The reason for the voltage boost up is that often only standardized power supply voltages are available for supplying power to electronic circuits. However, sometimes there are situations where a circuit needs a higher voltage than one available from the associated power supply. In addition, other circuits even require a negative voltage even though only positive voltages from a power supply are available. One example of such a circuit is an electrical erasable programmable read only memory (FEPROM), typically termed in the art as "flash memory." A flash memory may require a negative voltage to perform erase operations.

One circuit typically used for generating a desired voltage from an available power supply voltage is a charge pump. Charge pumps are used often for generating a higher positive voltage from an available power supply voltage. They are not often used for generating negative voltages due to the difficulties of regulating negative voltages. It is often desirable to use active devices in the regulation circuits since they typically consume relatively less power and take up less circuit real estate. However, active devices are typically not used for handling negative voltages since forward biasing of internal p-n junctions typically results. This is because the p-substrate of these active devices is connected to ground potential. Thus, placing a negative voltage on a source of an active device will forward bias the p-substrate, which produces undesirable consequences.

DETAILED DESCRIPTION OF THE INVENTION

Figure 1:
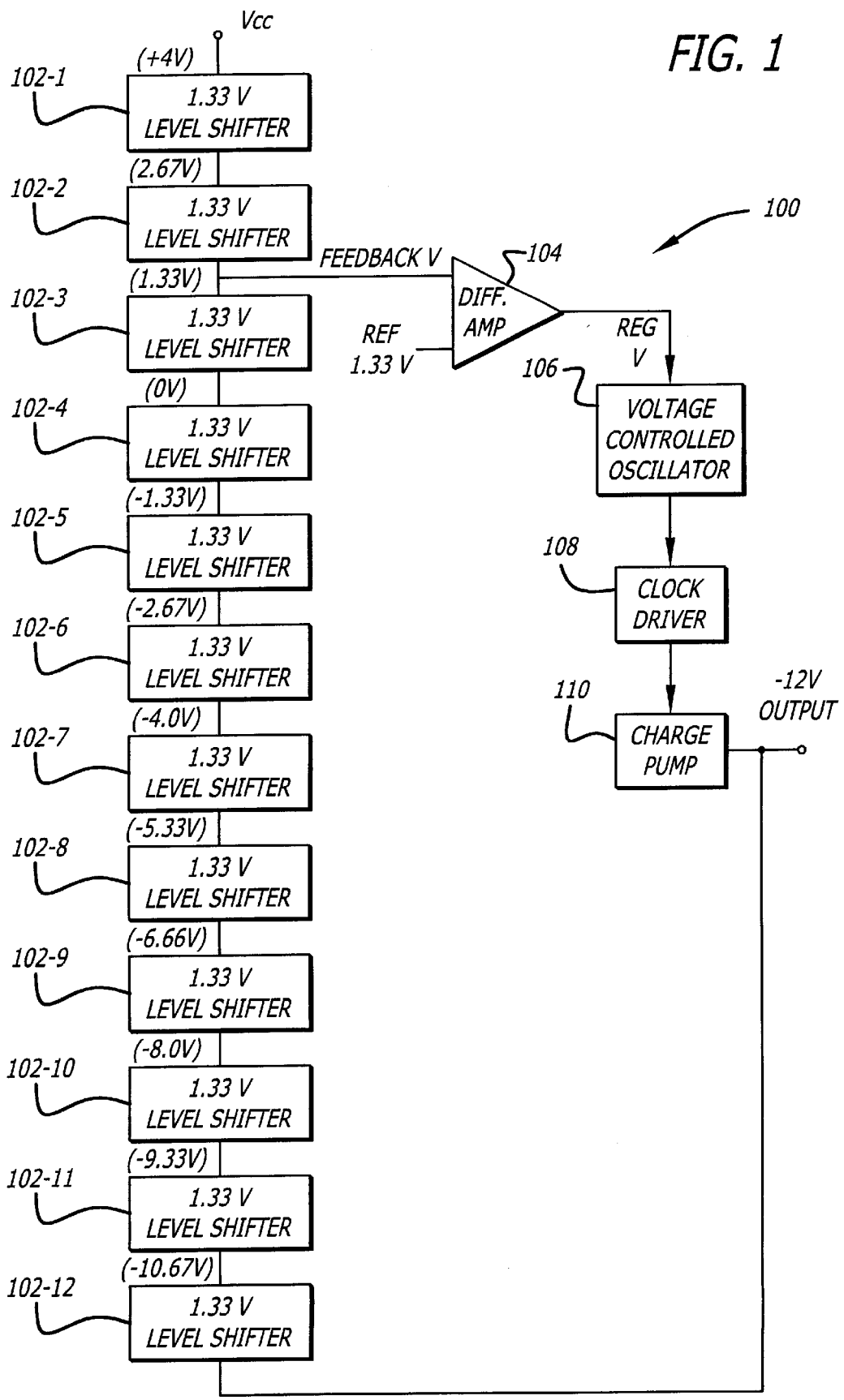
FIG. 1 illustrates a block diagram of an exemplary regulated charge pump in accordance with the invention.

FIG. 1 illustrates a block diagram of an exemplary regulated charge pump circuit 100 in accordance with the invention. The regulated charge pump circuit 100 comprises a level shift ladder 102, a differential amplifier 104, a voltage-controlled oscillator 106, a clock driver 108, and a charge pump 110. The level shift ladder 102 comprises a plurality of level shifters 102-1 through 102-12 connected in series. The top level shifter 102-1 receives a power supply voltage Vcc and the lowest level shifter 102-12 receives the output voltage of the charge pump 110. The power supply voltage Vcc can be positive or negative.

In the exemplary embodiment, the level shifters 102-1 through 102-12 are designed to provide substantially the same voltage shifts. Since the voltage across the entire level shift ladder 102 (Vcc−Output) is generally constant (i.e. regulated), each of the level shifters 102-1 through 102-12 is designed to produce a voltage shift according to the following equation:

$$\text{Level Shift} = (\text{Vcc} - \text{Output})/N \qquad \text{Equation 1}$$

where N is the number of level shifters in the level shift ladder 102. In the exemplary embodiment, the level shift ladder 102 has N=12 level shifters 102-1 through 102-12. If, for example, the power supply voltage Vcc is +4 Volts and the regulated output of the charge pump is −12 Volts, using Equation 1 each of the level shifters 102-1 through 102-12 provide approximately a 1.33-Volt shift. Accordingly, the respective voltages at the nodes between the level shifters 102-1 through 102-12 are shown in FIG. 1 next to the corresponding nodes.

One of the intermediate nodes of the level shift ladder 102 is applied to an input of the differential amplifier 104. The voltage on this intermediate node is the feedback voltage since it varies with the output of the charge pump 110. A reference voltage is applied to the other input of the differential amplifier 104. The reference voltage may be selected to correspond with one of the intermediate node voltages that would occur in a regulated output condition. In the exemplary embodiment, the intermediate node of the level shift ladder 102 between level shifters 102-2 and 102-3 has a feedback voltage of approximately 1.33 Volts under regulated conditions. If this intermediate node is used as an input to the differential amplifier 104, then the reference voltage may be set to 1.33 Volts as well.

The output of the differential amplifier 104 is a regulation voltage which varies as a function of the voltage difference between the feedback voltage and the reference voltage. The regulation voltage represents generally the error of the output voltage of the charge pump from its regulated value. The regulation voltage can vary linearly or non-linearly with the voltage difference between the feedback voltage and the reference voltage. In addition, the regulation voltage can also have a substantially constant offset voltage. In the exemplary embodiment, the regulation voltage varies from Vcc (e.g. +4 volts) to ground potential.

The regulation voltage at the output of the differential amplifier 104 is applied to the frequency control input of the voltage-controlled oscillator 106. The output frequency of the voltage-controlled oscillator 106 can be made to vary with or inversely with the regulation voltage. For example, if the regulation voltage is relatively high (e.g. near Vcc), the output frequency of the voltage-control oscillator 106 is lower than during regulated conditions in order to decrease the magnitude of the negative voltage at the output. If, on the other hand, the regulation voltage is relatively low (e.g. near ground potential), the output frequency of the voltage-controlled oscillator 106 is lower than during regulated conditions in order to increase the magnitude of the negative voltage at the output.

The output of the voltage controlled oscillator 106 is applied to the clock driver 108. The clock driver 108 performs a couple of functions. For instance, the clock driver 108 serves to buffer the output of the voltage-controlled oscillator 106. Additionally, the clock driver 108 increases the amplitude of the oscillator output to a sufficient level to drive the transistors associated with the pumping operation of the charge pump 110. The output of the charge driver 108 is applied to the charge pump 110 to drive its charge pumping operation in order to produce its negative output.

The regulation of the charge pump 110 is as follows. In the case the output voltage of the charge pump becomes more positive than its regulated voltage, then the feedback voltage on the tapped intermediate node of the level shift ladder is higher than its nominal value at regulation condition. The regulation voltage at the output of the differential amplifier 104 can be made relatively small. This relatively lower regulation voltage causes the output frequency of the voltage-controlled oscillator 106 to increase which causes the clock driver 108 to drive faster the pumping action of the charge pump 110. This causes the output to become more negative to compensate for the initial positive movement of the output.

Conversely, in the case the output voltage of the charge pump becomes more negative than its regulated voltage, then the feedback voltage on the tapped intermediate node of the level shift ladder is lower than its nominal value at regulation condition. The regulation voltage at the output of the differential amplifier 104 is accordingly relatively higher. This relatively higher voltage causes the output frequency of the voltage-controlled oscillator 106 to decrease which causes the clock driver 108 to drive slower the pumping action of the charge pump 110. This causes the output to become more positive to compensate for the initial negative movement of the output.

Figure 2A:
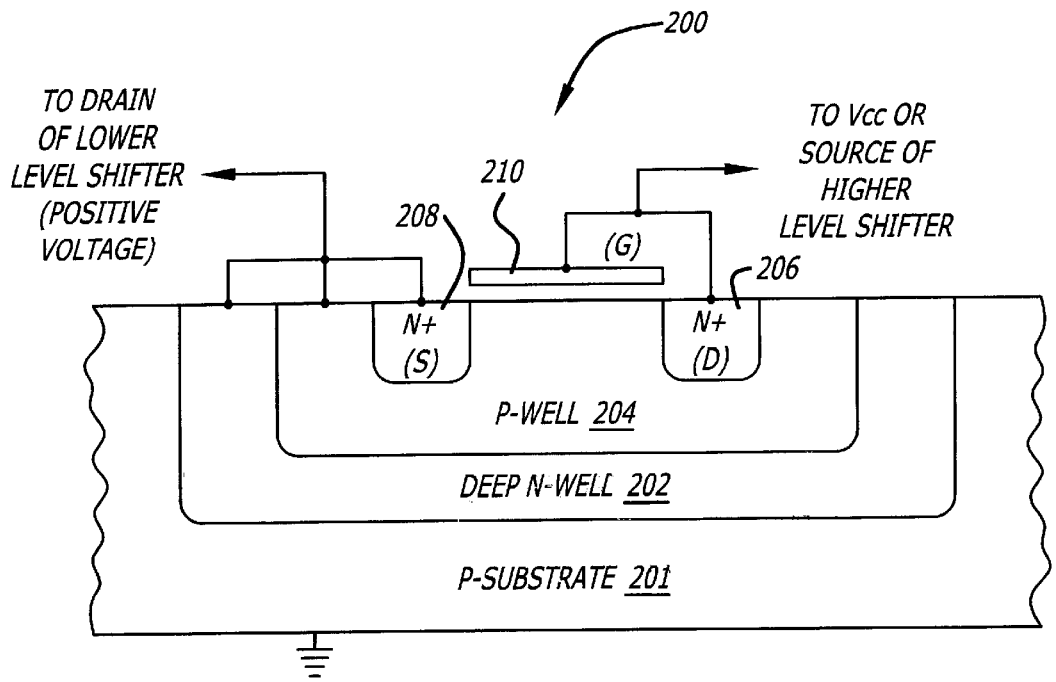
FIG. 2A–B illustrate cross-sectional views of an exemplary triple-well device that serves as an individual level shifter in accordance with the invention.
Figure 2B:
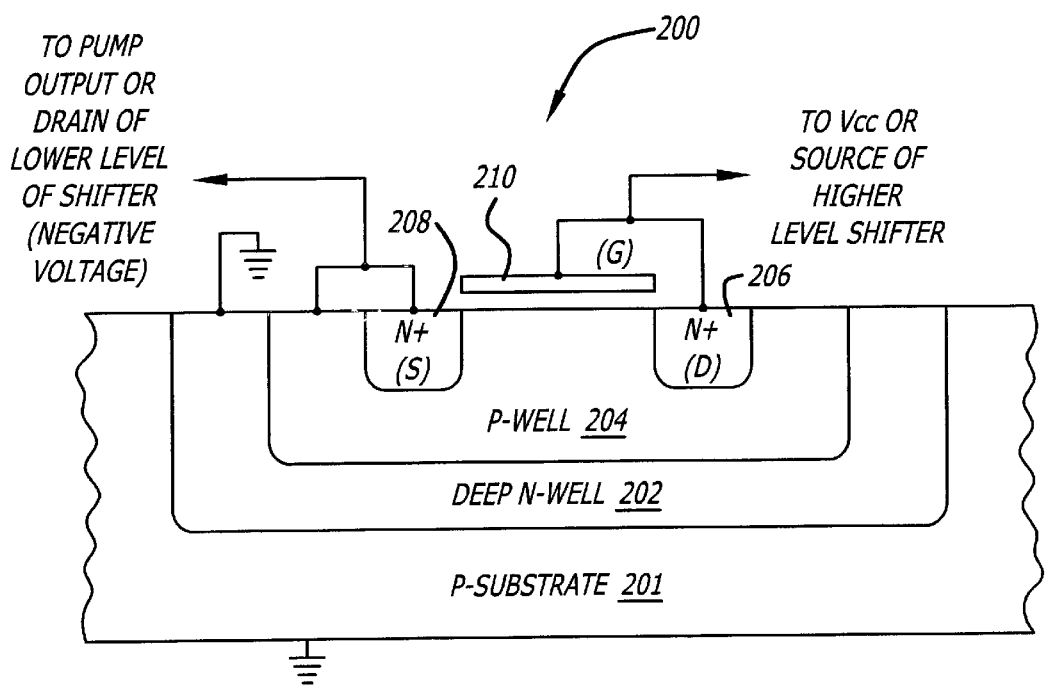

FIGS. 2A–B illustrate cross-sectional views of an exemplary triple-well device 200 that serves as an individual level shifter in accordance with the invention. FIG. 2A illustrates the connection of the triple well device 200 when the source (S) of the device is connected to a positive voltage with respect to ground potential. FIG. 2B illustrates the connection of the triple well device 200 when the source (S) of the device is connected to a negative voltage with respect to ground potential. If the source (S) of the device 200 is near ground potential, the device 200 can be connected in either way shown in FIG. 2A or 2B. The purpose of these different connections is to prevent forward biasing of p-n junctions within the device 200, as will be further explained.

Specifically, the exemplary triple well device 200 of the invention comprises a p-substrate 201, a deep n-well 202 formed within the p-substrate 201, and a p-well 204 formed within the deep n-well 202. The triple well device 200 further comprises a drain (D) n+ contact region 206 and a source (S) n+ contact region 208 both formed within the p-well 204, but spaced apart from each other. Additionally, the triple well device 200 comprises a gate (G) electrode 210 situated above the p-substrate 201 and horizontally between the drain (D) n+ contact region 206 and the source (S) n+ contact region 208.

As an individual level shifter of a level shift ladder, the triple well device 200 is diode connected. That is, the gate (G) 210 is electrically connected to the drain (D) 206. The gate (G) 210 and drain (D) 206 are connected to either the power supply voltage Vcc if it is the first level shifter 102-1 in the level shift ladder 102, or connected to the source (S) of the previous (i.e. the triple well device immediately higher up the level shift ladder) individual level shifter if it is not the first level shifter 102-1 in the level shift ladder. The source (S) 208 of the triple well device 200 is electrically connected to the p-well 204. The source (S) 208 and the p-well 204 are connected to either the output of the charge pump 110 if it is the last level shifter 102-12 in the level shift ladder 102, or connected to the drain (D) of the next (i.e. the triple well device immediately lower on the level shift ladder) individual level shifter if it is not the last level shifter 102-12 in the level shift ladder 102. The p-substrate 201 is connected to ground potential.

In the case where a positive voltage is to be seen by the source (S) 208 of the triple well device 200 as shown in FIG. 2A, the source (S) 208 and the p-well 204 are both electrically connected to the deep n-well 202. This is to prevent forward biasing of the p-well 204 and deep n-well 202 junction. In the case where a negative voltage is to be seen by the source (S) 208 of the triple well device 200 as shown in FIG. 2B, the deep n-well 202 is connected to ground potential, and the source (S) 208 and the p-well 204 are not electrically connected to the deep n-well 202. This is to prevent forward biasing of the p-substrate 201 and deep n-well 202 junction. In the case where approximately ground potential is to be seen by the source (S) 208 of the triple well device 200, the device 200 can be connected as shown in either FIGS. 2A or 2B with the pre-caution that the variation of the voltage at the source (S) will not cause forward biasing of the p-n junctions of the device 200.

Figure 3:
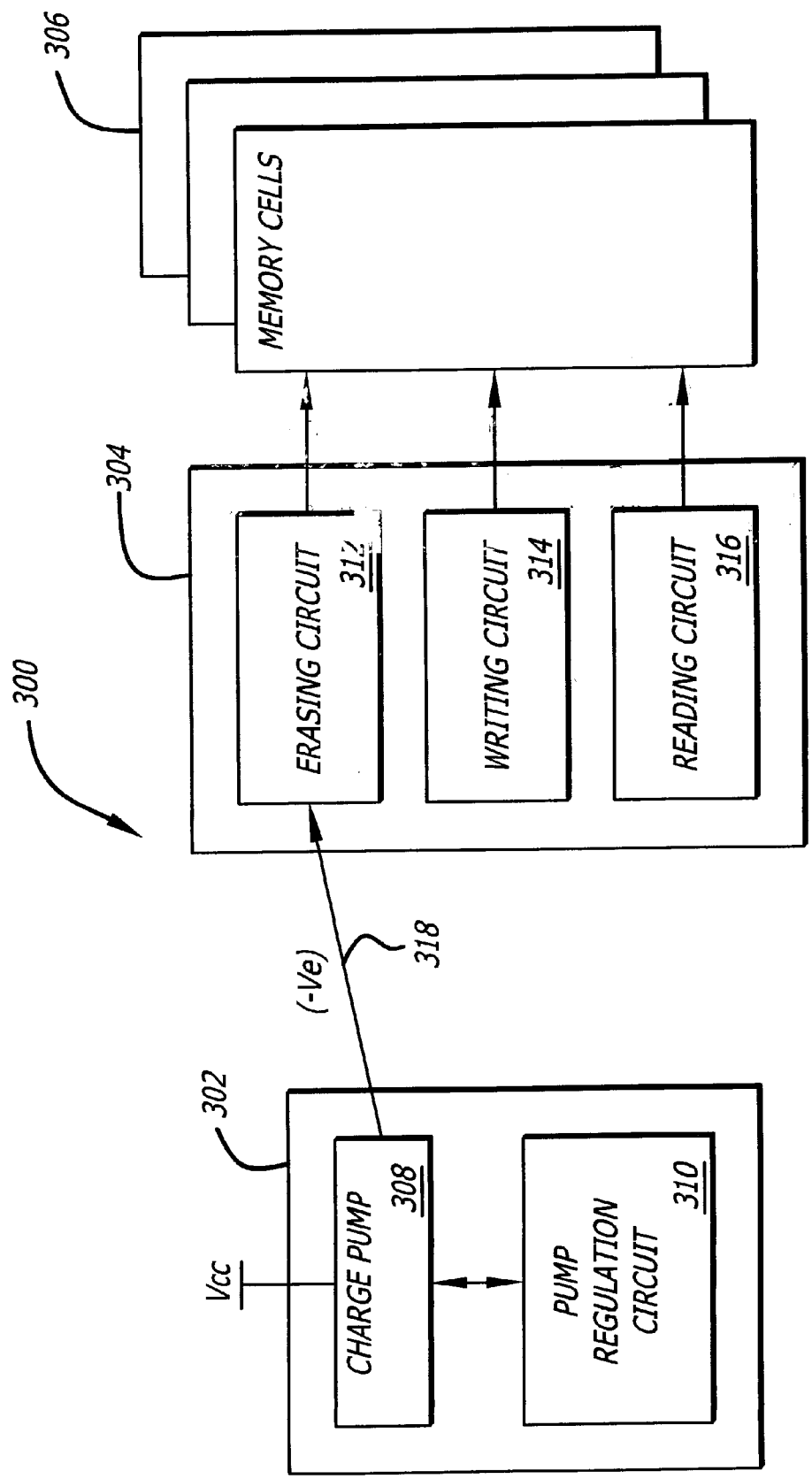
FIG. 3 illustrates a block diagram of an exemplary memory circuit in accordance with the invention.

FIG. 3 illustrates a block diagram of an exemplary memory circuit 300 in accordance with the invention. The memory circuit 300 comprises a regulated charge pump circuit 302 in accordance with the invention, a memory operations circuit 304, and one or more memory arrays 306. The regulated charge pump circuit 302 in accordance with the invention comprises a charge pump 308 and a pump regulation circuit 310 such as the ones described with reference to FIGS. 1 and 2. The memory operations circuit 304 comprises an erasing circuit 312, a writing circuit 314, and a reading circuit 316. These circuits control respectively the erasing, writing and reading of the one or more memory arrays 306. The charge pump 308 generates a regulated negative voltage $-V_E$ which is sent to the erasing circuit 312 along line 318. The erasing circuit 312, in turn, uses the regulated negative voltage $-V_E$ to erase one or more cells of the memory arrays 306. This is just one example application of many for the regulated charge pump circuit 302 of the invention.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

What is claimed is:

1. An apparatus, comprising:
   a charge pump to generate an output negative voltage; and
   a regulation circuit to regulation said output negative voltage comprising:
   a level shift ladder comprising a plurality of level shifters connected in series, wherein one of said level shifters is to receive a power supply voltage and another of said level shifters is to receive said output negative voltage;
   a differential amplifier to generate a regulation voltage varying as a function of a difference between a feedback voltage at an intermediate node between consecutive level shifters of said level shift ladder and a reference voltage; and
   an oscillator to generate an oscillating signal to cause a pumping operation of said charge pump in accordance with said regulation voltage such that said output negative voltage is maintained within a specified voltage specification.

2. The apparatus of claim 1, further comprising a clock driver for buffering an output of said oscillator.

3. The apparatus of claim 1, wherein said one of said level shifters that receives said power supply voltage is positioned at a top of said level shift ladder.

4. The apparatus of claim 1, wherein said another of said level shifters that receives said output negative voltage is positioned at a bottom of said level shift ladder.

5. The apparatus of claim 1, wherein at least one of said level shifters comprises a triple well device comprising:
 a p-substrate;
 a deep n-well formed within said p-substrate;
 a p-well formed within said deep n-well;
 a drain contact region formed within said p-well;
 a source contact region formed within said p-well and spaced apart from said drain contact region; and
 a gate electrode formed over said p-substrate horizontally between said drain and source contact regions.

6. The apparatus of claim 5, wherein said gate electrode is electrically connected to said drain contact region.

7. The apparatus of claim 5, wherein said source contact region is electrically connected to said p-well.

8. The apparatus of claim 5, wherein said source contact region and said p-well are both electrically connected to said deep n-well if a negative voltage is applied to said source contact region.

9. The apparatus of claim 5, wherein said deep n-well is electrically connected to a ground potential if a positive voltage is applied to said source contact region.

10. The apparatus of claim 5, wherein said p-substrate is electrically connected to a ground potential.

11. An apparatus, comprising:
 a memory array comprising a plurality of memory cells;
 an erasing circuit to erase one or more of said memory cells using a regulated negative voltage;
 a charge pump to generate said regulated negative voltage; and
 a regulation circuit to regulate said regulated negative voltage comprising:
  a level shift ladder comprising a plurality of level shifters connected in series, wherein one of said level shifters is to receive a power supply voltage and another of said level shifters is to receive said regulated negative voltage;
  a differential amplifier to generate a regulation voltage varying as a function of a difference between a feedback voltage at an intermediate node between consecutive level shifters of said level shift ladder and a reference voltage; and
  an oscillator to generate an oscillating signal to cause a pumping operation of said charge pump in accordance with said regulation voltage such that said regulated negative voltage is maintained within a specified voltage specification.

12. The apparatus of claim 11, further comprising a clock driver for buffering an output of said oscillator.

13. The apparatus of claim 11, wherein said one of said level shifters that receives said power supply voltage is positioned at a top of said level shift ladder.

14. The apparatus of claim 11, wherein said another of said level shifters that receives said regulated negative voltage is positioned at a bottom of said level shift ladder.

15. The apparatus of claim 11, wherein at least one of said level shifters comprises a triple well device comprising:
 a p-substrate;
 a deep n-well formed within said p-substrate;
 a p-well formed within said deep n-well;
 a drain contact region formed within said p-well;
 a source contact region formed within said p-well and spaced apart from said drain contact region; and
 a gate electrode formed over said p-substrate horizontally between said drain and source contact regions.

16. The apparatus of claim 15, wherein said gate electrode is electrically connected to said drain contact region.

17. The apparatus of claim 15, wherein said source contact region is electrically connected to said p-well.

18. The apparatus of claim 15, wherein said source contact region and said p-well are both electrically connected to said deep n-well if a negative voltage is applied to said source contact region.

19. The apparatus of claim 15, wherein said deep n-well is electrically connected to a ground potential if a positive voltage is applied to said source contact region.

20. The apparatus of claim 15, wherein said p-substrate is electrically connected to a ground potential.

21. A method, comprising:
 pumping charges to generate an output negative voltage;
 generating a feedback voltage which varies in accordance with said output negative voltage, wherein generating said feedback voltage comprises:
  generating a plurality of level shifted voltages through a use of a level shift ladder having a power supply voltage applied to a first end of said level shift ladder and said output negative voltage applied to a second end of said level shift ladder; and
  selecting one of said level shifted voltages to generate said feedback voltage;
 producing a regulation voltage which varies as a function of said feedback voltage and a reference voltage; and
 controlling said pumping of charges in accordance with said regulation voltage.

22. The method of claim 21, wherein generating a plurality of level shifted voltages comprises using a plurality of triple well device being diode connected to generate said respective plurality of level shifted voltages.

23. The method of claim 21, wherein producing said regulation voltage comprises using a differential amplifier to generate said regulation voltage having as inputs said feedback voltage and said reference voltage.

24. The method of claim 21, wherein controlling said pumping of charges comprises generating an oscillating signal whose frequency varies as a function of said regulation voltage, wherein said oscillating signal controls a rate of said pumping of charges.

25. The method of claim 24, wherein generating said oscillating signal comprises using a voltage-controlled oscillator responsive to said regulation voltage to generate said oscillating signal.

26. The method of claim 25, further comprising buffering an output of said voltage-controlled oscillator.

\* \* \* \* \*